US010385441B2

(12) United States Patent
Oh et al.

(10) Patent No.: US 10,385,441 B2
(45) Date of Patent: Aug. 20, 2019

(54) MASK FRAME ASSEMBLY AND MANUFACTURING METHOD OF THE SAME

(71) Applicant: Samsung Display Co., Ltd., Yongin-si (KR)

(72) Inventors: Yoonchan Oh, Yongin-si (KR); Jongho Yang, Yongin-si (KR); Youngsun Cho, Yongin-si (KR); Jaemin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 456 days.

(21) Appl. No.: 14/994,906

(22) Filed: Jan. 13, 2016

(65) Prior Publication Data

US 2016/0333469 A1   Nov. 17, 2016

(30) Foreign Application Priority Data

May 13, 2015 (KR) .......................... 10-2015-0066943

(51) Int. Cl.
| | |
|---|---|
| *C23C 14/04* | (2006.01) |
| *C23C 16/04* | (2006.01) |
| *C23C 16/458* | (2006.01) |

(52) U.S. Cl.
CPC .......... *C23C 14/042* (2013.01); *C23C 16/042* (2013.01); *C23C 16/4585* (2013.01)

(58) Field of Classification Search
CPC .. C23C 14/042; C23C 16/042; C23C 16/4585
USPC .................................................. 29/448, 449
See application file for complete search history.

(56) References Cited

U.S. PATENT DOCUMENTS

| | | | | |
|---|---|---|---|---|
| 312,607 | A * | 2/1885 | Britton ................... | B21D 25/04 72/302 |
| 2,194,551 | A * | 3/1940 | Holman ................. | B21D 25/00 140/109 |
| 2,963,052 | A * | 12/1960 | Cook ..................... | B21D 25/00 140/109 |
| 2004/0020435 | A1* | 2/2004 | Tsuchiya ............... | C23C 14/042 118/723 VE |
| 2012/0174863 | A1* | 7/2012 | Park ...................... | C23C 14/042 118/504 |
| 2014/0158044 | A1* | 6/2014 | Han ...................... | C23C 14/042 118/504 |
| 2015/0007767 | A1* | 1/2015 | Ko ........................ | B05C 21/005 118/504 |

(Continued)

FOREIGN PATENT DOCUMENTS

| | | |
|---|---|---|
| JP | 2007-291461 | 11/2007 |
| KR | 10-2003-0075221 | 9/2003 |

(Continued)

*Primary Examiner* — Christopher M Koehler
(74) *Attorney, Agent, or Firm* — H.C. Park & Associates, PLC

(57) ABSTRACT

A mask frame assembly and a manufacturing method of the same are provided. The mask frame assembly includes a frame unit having a plurality of frames to form an opening, a deposition mask extended in a first direction and fixed to the frame unit, and a gap adjusting unit installed between one frame and another frame disposed adjacent to the one frame among the plurality of frames, wherein the gap adjusting unit adjusts a distance between the one frame and the another frame.

10 Claims, 5 Drawing Sheets

(56) References Cited

U.S. PATENT DOCUMENTS

2015/0068456 A1* 3/2015 Kuriyama ............ C23C 14/042
                                                    118/505

FOREIGN PATENT DOCUMENTS

| KR | 10-2010-0111129 | 10/2010 |
| KR | 10-2014-0078310 | 6/2014 |
| KR | 10-2014-0087823 | 7/2014 |

* cited by examiner

MASK FRAME ASSEMBLY AND MANUFACTURING METHOD OF THE SAME

CROSS-REFERENCE TO RELATED APPLICATION

This application claims priority from and the benefit of Korean Patent Application No. 10-2015-0066943, filed on May 13, 2015, which is hereby incorporated by reference for all purposes as if fully set forth herein.

BACKGROUND

Field

Exemplary embodiments relate to a mask frame assembly and a manufacturing method of the same.

Discussion of the Background

Electronic apparatuses based on mobility have been widely used. A mobile electronic apparatus includes a small-sized electronic apparatus, such as a mobile phone, and a tablet portable computer.

Such a mobile electronic apparatus includes a display apparatus to support various functions and to provide a user with visual information such as an image (still/moving image). Recently, according to miniaturization of components to drive the display apparatus, the display apparatus is relatively more important in the electronic apparatus, and has been developed to have a bendable structure to have an angle from a flat state.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask frame assembly and a manufacturing method of the same.

Additional aspects will be set forth in part in the description which follows, and, in part, will be apparent from the disclosure, or may be learned by practice of the inventive concept.

According to exemplary embodiments, a mask frame assembly may include a frame unit having a plurality of frames to form an opening, a deposition mask extended in a first direction and fixed to the frame unit, and a gap adjusting unit installed between one frame and another frame disposed adjacent to the one frame among the plurality of frames, wherein the gap adjusting unit adjusts a distance between the one frame and the another frame.

According to exemplary embodiments, the frame unit may include a pair of first frames disposed opposite to each other and a pair of second frames disposed at both ends of the first frames, and at least one of the second frames may be disposed to linearly move in the first direction with respect to the first frames.

According to exemplary embodiments, both ends of the deposition mask may be fixed to the corresponding second frames.

According to exemplary embodiments, the first frames may be shorter than the second frames.

According to exemplary embodiments, the deposition mask may be extended and then fixed to the frame unit in a state that a distance between the adjacent frames is decreased by an external force applied to the frame unit.

According to exemplary embodiments, the external force may be removed from the frame unit, the distance between the adjacent frames may changes to a predetermined distance according to a restoring force stored in the gap adjusting unit.

According to exemplary embodiments, the deposition mask may include one or more deposition masks, and an amount of the external force applied to the frame unit may be variable according to the number of the deposition masks.

According to exemplary embodiments, the amount of the external force applied to the frame unit may be decreased when the number of the deposition masks is increased.

According to exemplary embodiments, the gap adjusting unit may include a guide member guiding at least one or more frames among the plurality of frames to linearly move in the first direction, and a restoring force generation member surrounding at least a portion of the guide member and connecting the adjacent frames.

According to exemplary embodiments, the guide member may be formed as a prismatic shape column and inserted into one of the frames to linearly move in the first direction.

According to exemplary embodiments, a pair of first frames arrayed in a first direction, and a pair of second frames arrayed in a second direction to form an opening with the first frames, a gap adjusting unit configured to connect the first frames and the second frames to adjust size of the opening, a deposition mask extending in a first direction and fixed to the pair of second frames.

According to exemplary embodiments, the size of the opening may change in the first direction.

According to exemplary embodiments, the deposition mask may be fixed to the pair of the second frames in a state that the size of the opening is reduced when the pair of the second frames contract in the first direction.

According to exemplary embodiments, the deposition mask may include one or more deposition masks, and an amount of external force applied to the second frames may decrease when the number of the deposition masks increase.

According to exemplary embodiments, the gap adjusting unit may include a guide member guiding the second frames to linearly move in the first direction, and a restoring force generation member surrounding at least a portion of the guide member and having one end fixed to an end of the first frame and the other end fixed to an end of the second frame.

According to exemplary embodiments, a method of manufacturing a mask frame assembly may include arranging a deposition mask with respect to a frame unit having a plurality of frames to form an opening of which a size is adjustable in a first direction, reducing the size of the opening by applying an external force to the frame unit in the first direction, and extending the deposition mask in the first direction and fixing the extended deposition mask to the frame unit.

According to exemplary embodiments, the step of applying the external force to the frame further may include contracting a gap adjusting unit disposed between the frames in the first direction.

According to exemplary embodiments, the method may further include removing the external force from the frame unit.

According to exemplary embodiments, the removing the external force from the frame unit may include adjusting the size of the opening to a predetermined size according to a restoring force stored in the gap adjusting unit.

According to exemplary embodiments, the deposition mask may include one or more deposition masks, and an amount of the external force applied to the frame unit when the number of the deposition masks increase.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
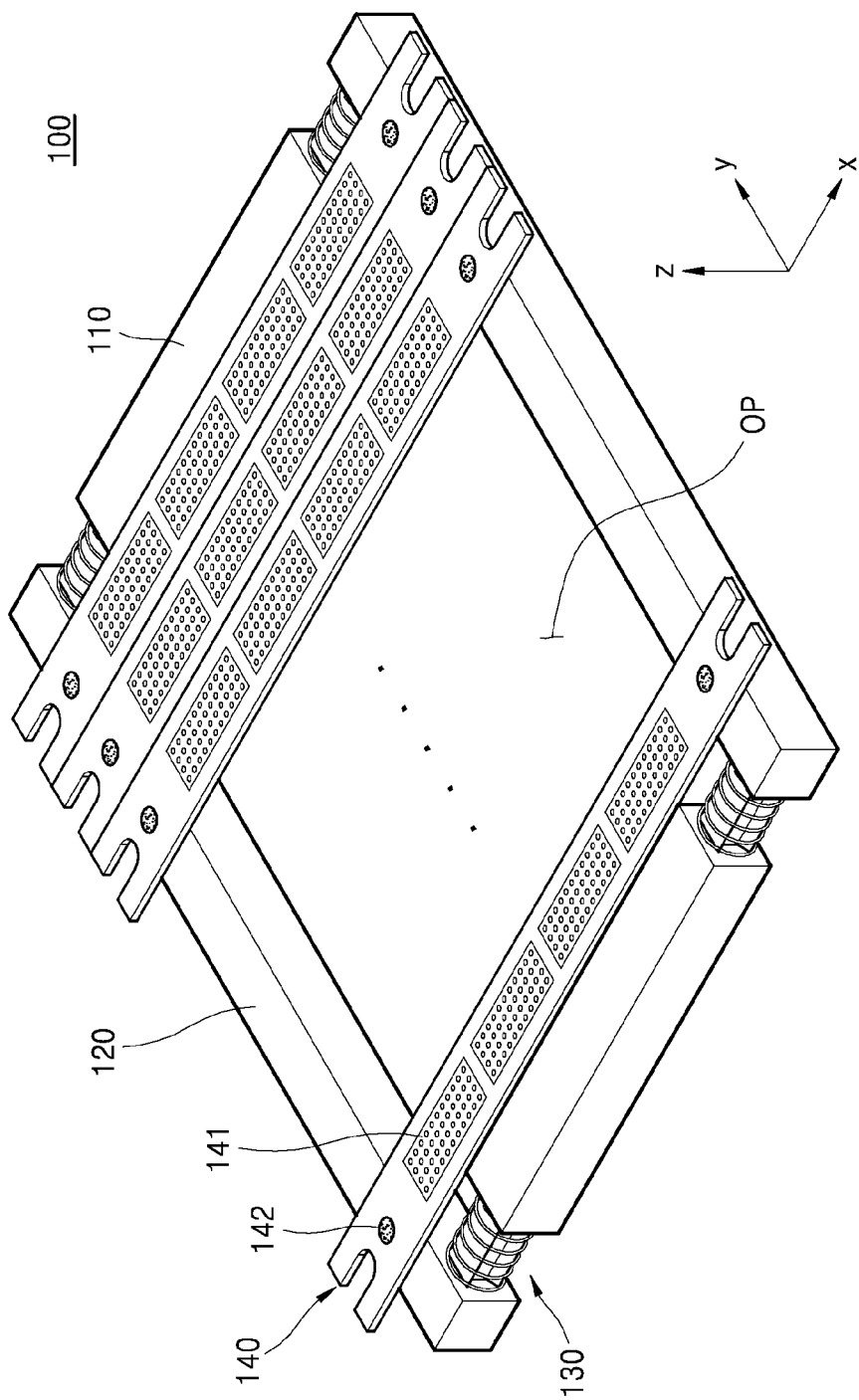
FIG. 1 is a perspective view illustrating a mask frame assembly according to an embodiment of the present inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments of the present general inventive concept will be explained with reference to drawings, wherein like reference numerals refer to like elements throughout.

Figure 2:
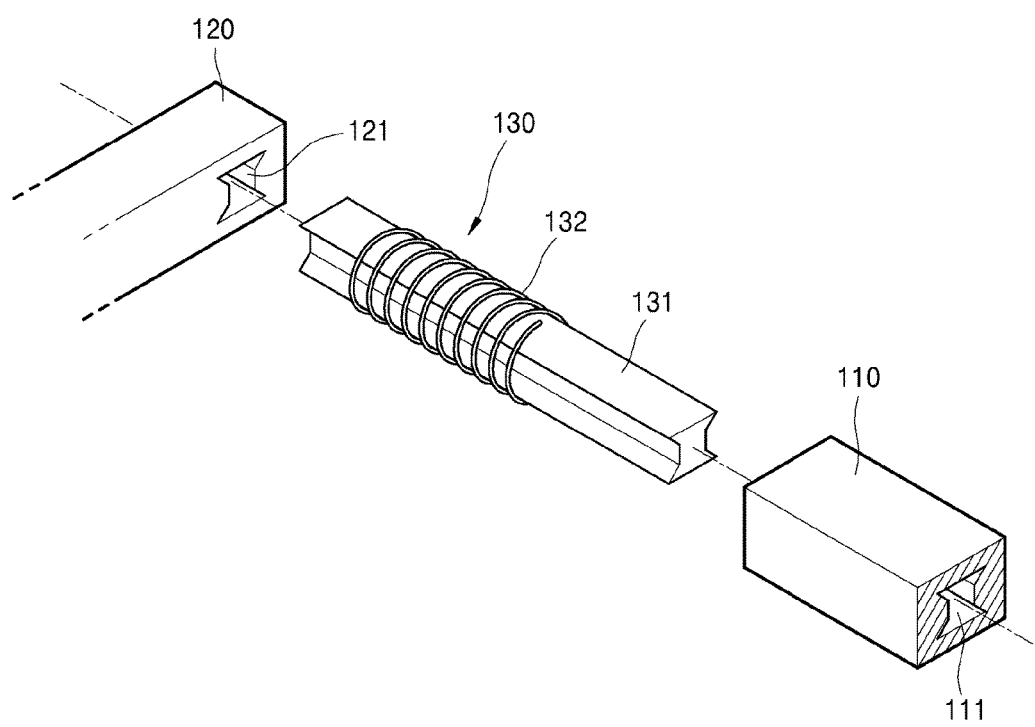
FIG. 2 is an exploded perspective view illustrating a gap adjusting unit of the mask frame assembly of FIG. 1 according to an embodiment of the present inventive concept.

FIG. 1 is a perspective view illustrating a mask frame assembly 100 according to an embodiment of the present inventive concept, and FIG. 2 is an exploded perspective view illustrating a gap adjusting unit of the mask frame assembly 100 of FIG. 1.

Referring to FIGS. 1 and 2, the mask frame assembly 100 may include a frame unit having a pair of first frames 110 and a pair of second frames 120, a gap adjusting unit 130, and at least one mask 140 for deposition (hereinafter, deposition mask 140).

In the frame unit, a plurality of frames may form (or define) at least one opening OP. In the frame unit, the first frames 110 and the second frames 120 may form (or define) an opening OP to allow a deposition material to pass therethrough in a direction z. For example, the first frames 110 may be arrayed in a direction x, and the second frames 120 may be arrayed in a direction y.

The frame unit may be formed using a metal or a composite resin. Although the frame unit may have a rectangular shape to form one or more openings, an embodiment of the present inventive concept is not limited thereto. It is possible that the frame unit may be formed with various shapes, for example, a circle or a hexagon. However, for the purpose of descriptions, a rectangular frame shape will be explained as the frame unit hereinafter.

The pair of first frames 110 may be disposed opposite to each other and arranged in a lengthwise direction of the deposition mask 140. The pair of second frames 120 may be disposed opposite to each other and arranged perpendicular to the direction of the first frames 110. The second frames 120 are connected to both ends of the first frames 110 through the gap adjusting unit 130, and the deposition mask 140 may be fixed on the second frames 120 at both ends thereof. Each of the second frames 120 may be longer than each of the first frames 110. That is, the frame unit may be formed as a rectangular shape.

Referring to FIG. 2, the gap adjusting unity 130 may include a guide member 131 to connect the adjacent frames (the first frame 110 and the second frame 120) and a restoring force generation member 132 to generate a restoring force to be applied to the frame unit.

The gap adjusting unit 130 may be installed between one frame and the other one frame disposed adjacent to the one frame among the plurality of frames to adjust a gap between the frames. That is, the gap adjusting unit 130 may be installed between the first frame 110 and the second frame 120 to adjust a gap between the first frame 110 and the second frame 120. The gap adjusting unit 130 may adjust a size of the opening OP formed by the pair of first frames 110 and the pair of second frames 120.

Each of the first frames 110 may have a fixing groove 111, and the guide member 131 is inserted into the fixing groove 111 and then fixed to the first frame 110 through the fixing groove 111. Each of the second frames 120 may have a guide groove 121 to guide a linear movement of the guide member 131. The guide member 131 may be fixed to the fixing groove 111 of the first frame 110 and inserted into the guide groove 121 of the second frame 120 to connect the first frame 110 and the second frame 120.

In other words, the guide member 131 may connect a plurality of frames and may guide one or more frames among the plurality of frames to linearly move. The guide member 131 may have one end fixedly coupled to the first frame 110 and the other end movably inserted into the second frame 120. The second frame 120 is installed to move along the guide member 131 such that the second frame 120 can relatively move with respect to the first frame 110.

The guide member 131 may have a circular shape or a prismatic shape. The fixing groove 111 and the guide groove 121 may be formed to have a shape corresponding to the shape of the guide member 131. The guide member 131 of the prismatic shape may prevent the frame unit from being twisted.

The mask frame assembly 100 is provided to maintain the deposition mask 140 to be flat for precise deposition. Since the first frames 110 and the second frames 120 are connected through the gap adjusting unit 130, it is possible that the first frame 110 and the second frame 120 may be deformed according to a position movement of the gap adjusting unit 130. That is, the first frames 110 and the second frames 120 may be misaligned due to an external force applied to the frame unit by a press unit 20 of FIG. 3B, for example, and/or a tensile force generated after extending and welding of the deposition mask 140.

As mentioned before, the guide member 131 may have a prismatic shape to prevent twisting of the first frame 110 and the second frame 120. For example, the guide member 131 may be formed with two up/down symmetrical trapezoid shapes connected with respect to its center line to prevent deformation of the first frame 110 and the second frame 120.

The restoring force generation member 132 may connect the adjacent frames and may be disposed to surround the guide member 131. The restoring force generation member 132 may not be limited to a particular material or shape but any material or shape to generate a restoring force applied to the frame unit. For example, the restoring force generation member 132 may include a material, such as rubber, silicone, wire, etc., with resiliency, and may be formed with a linear actuator, a spring, a rod, etc. For purpose of descriptions, a spring wire will be explained as the restoring force generation member 132 hereinafter.

The restoring force generation member 132 may have one end fixed to an end of the first frame 110 and the other end fixed to an end of the second frame 120. The restoring force generation member 132 may be formed to surround at least a portion of the guide member 131. The restoring force generation member 132 may be elastic and may store an external force applied to the frames as a restoring force.

The second frame 120 may linearly move along the guide member 131 inserted into the guide groove 121. That is, the second frame 120 may linearly move in a first direction (i.e. x direction of FIG. 1) parallel to a lengthwise direction of the first frame 110. A size of the opening OP formed by the frame unit may change in the first direction according to the linear directional movement of the second frame 120.

An external unit, such as the external press unit 20, presses the second frame 120 in the first direction to reduce a distance between opposite sides of the second frame 120. When the distance between the opposite sides of the second frame 120 is reduced, the size of the opening OP formed by the frame unit is reduced as illustrated in FIG. 3B.

When a pressing force applied to the second frame 120 is removed, the restoring force generation member 132 may apply a restoring force to the frame unit. When the press unit 20 releases the pressing force, the restoring force generation member 132 may generate the restoring force in a direction opposite to the direction of the pressing force.

The deposition mask 140 may include a deposition pattern portion 141 to form one or more deposition patterns on a substrate and a welding portion 142 fixed to the frame unit. The deposition mask 140 may be formed as a large single unit to be coupled to the frame unit. And the deposition mask 140 may be formed as a plurality of stick-like shapes to distribute a weight thereof. An embodiment of the present inventive concept is not limited thereto. However, for the purpose of descriptions, the plurality of stick-like shapes will be explained as the deposition mask 140.

The deposition mask 140 may be extended in the first direction to be fixed to the frame unit. That is, both ends of the deposition mask 140 may be fixedly coupled to the second frames 120 by the welding portion 142.

The deposition mask 140 may be coupled to the frame unit while being extended in a state that a distance between the adjacent frames according to an external force applied to the frame unit, and thereafter the external force applied to the frame unit may be removed. In a state that a length of the gap adjusting unit 130 is reduced according to an external force, the deposition mask 140 is fixed to the second frames 120.

Figure 3A:
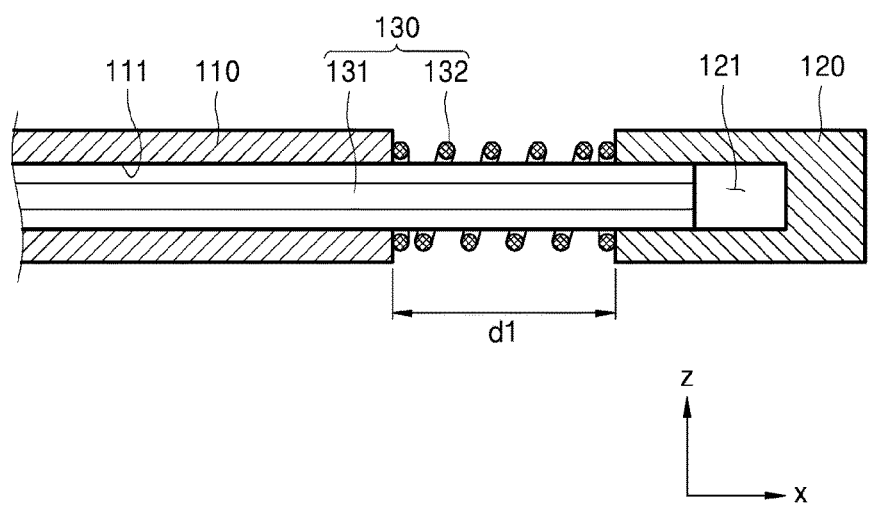
FIGS. 3A through 3D are cross-sectional views illustrating manufacturing methods of the mask frame assembly of FIG. 1 according to an embodiment of the present inventive concept.
Figure 3B:
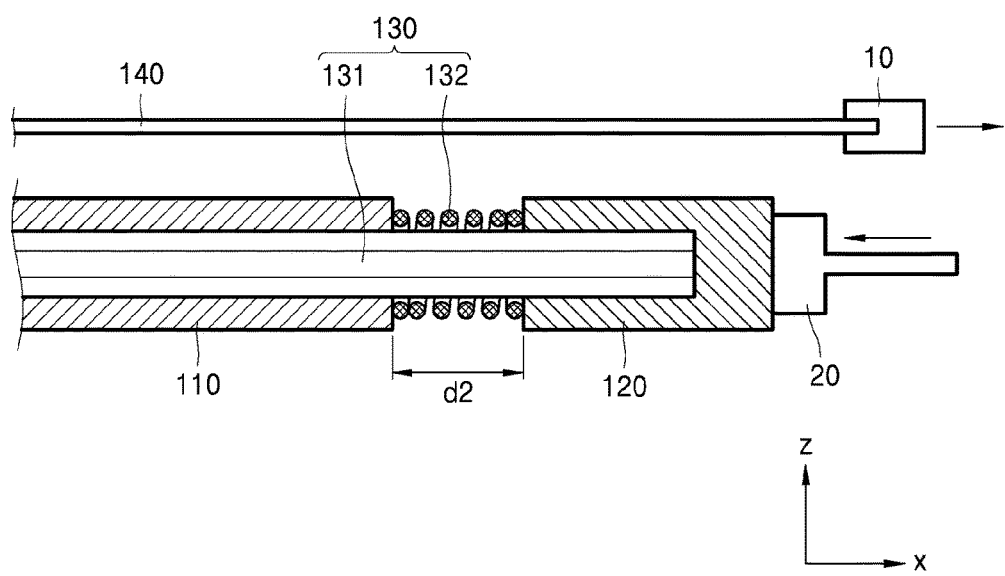
Figure 3C:
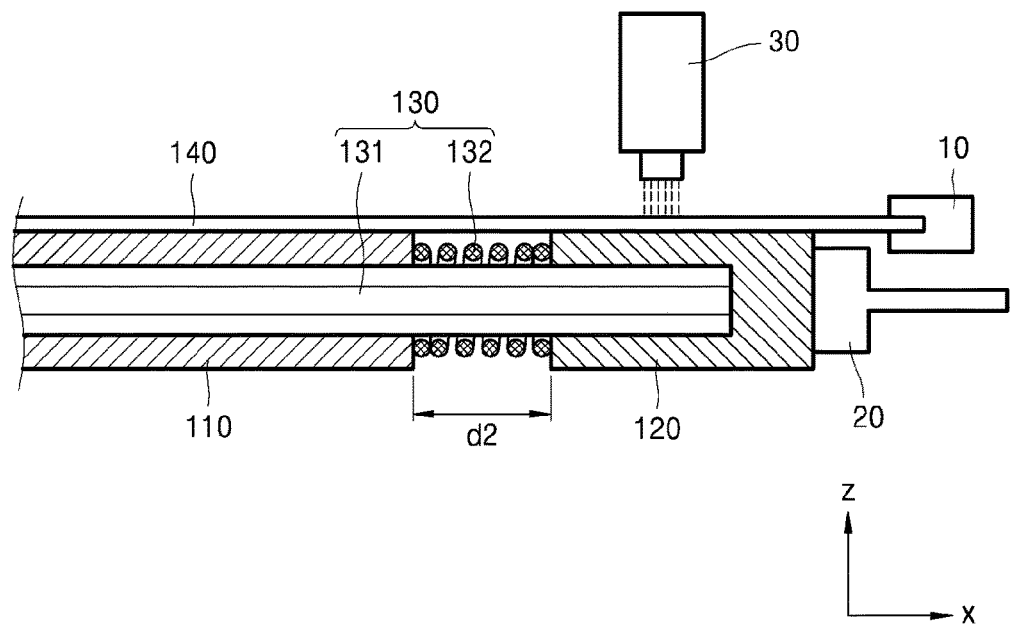
Figure 3D:
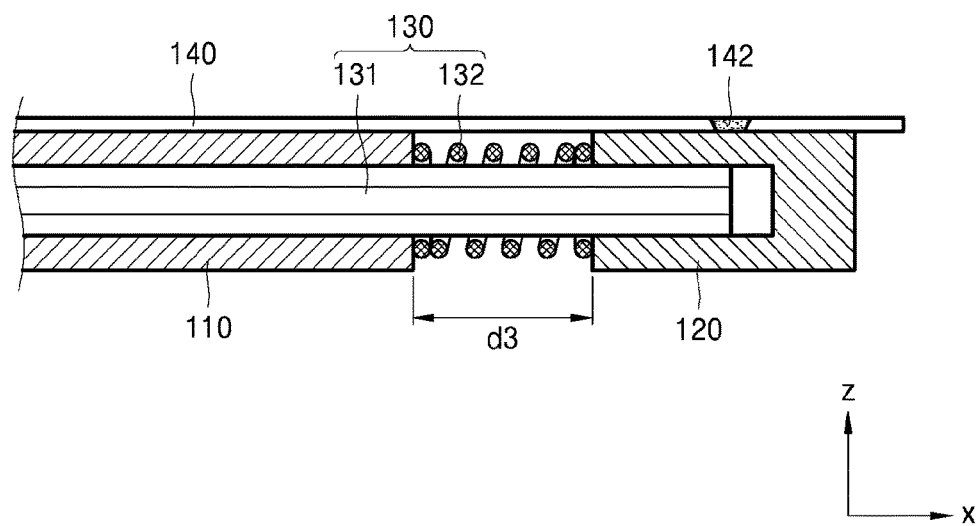

When the external force applied to the frame unit is removed, a distance between the frames is maintained to a third distance "d3" in a direction x according to the restoring force stored in the gap adjusting unit 130 as illustrated in FIG. 3D. According to the restoring force of the gap adjusting unit 130 applied to the first frame 110 and the second frame 120, the first frame 110 and the second frame 120 may have the third distance "d3" therebetween.

FIG. 3A through 3D are cross-sectional views illustrating manufacturing methods of the mask frame assembly 100 of FIG. 1 according to an embodiment of the present inventive concept.

The manufacturing method of the mask frame assembly 100 may include arranging the deposition mask 140 with respect to the frame unit, applying an external force to the frame unit, extending the deposition mask 140 and fixing the deposition mask 140 to the frame unit while the deposition mask 140 is extended, and removing the external force applied to the frame unit.

Referring to FIGS. 1 and 3A, the arranging of the deposition mask 140 with respect to the frame unit may include arranging the deposition pattern portion 141 of the deposition mask 140 to correspond to the opening OP as illustrated in FIG. 3A. A distance between the first frame 110 and the second frame 120 may be a first distance "d1" since the external force does not apply to the frame unit.

Then referring to FIG. 3B, the applying of the external force to the frame unit may include pressing at least one of the second frames 120 in the first direction by using the press unit 20. An amount of a pressing force may be determined to minimize deformation of the deposition pattern portion after the deposition mask 140 is fixed to the frame unit. The second frame 120 moves along the guide member 131 to reduce the distance between the adjacent frames and the size of the gap adjusting unit 130. That is, a distance between the first frame 110 and the second frame 120 may change from a first distance "d1" to a second distance "d2" as illustrated in FIGS. 3A and 3B.

Also, as illustrated in FIG. 3B, the extending unit 10 may extend the deposition mask 140 in the first direction before fixing of the deposition mask 140 to the frame unit because the deposition mask 140 is arranged to be flat such that the mask frame assembly 100 performs precise deposition on a substrate. Thereafter, the welding unit 30 may fix both ends of the deposition mask 140 to the second frames 120 as illustrated in FIG. 3C.

Referring to FIG. 1, the deposition mask 140 may be a plurality of deposition masks installed to block the opening OP of the frame unit. A plurality of the deposition masks 140 may be fixed to the second frames 120 according to the above-described method.

The pressing unit 20 may apply different amounts of force to the frame unit according to the number of deposition masks 140 fixed to the frame unit. That is, an amount of an external force applied to the frame unit may be reduced according to the increase of the number of deposition masks 140 fixed to the frame unit.

As the number of deposition masks 140 fixed to the frame unit increases, a force also may increase to maintain an interval between the second frames 120 according to the fixed deposition masks 140. Accordingly, the press unit 20 may press the second frame 120 with a reduced amount of a press force. In this case, the distance between the first frame 110 and the second frame 120 may be maintained as the second distance d2 as shown in FIG. 3C.

Referring to FIG. 3D, the press unit 20 may remove the external force when all of the deposition masks 140 are fixed to the frame unit. Since the restoring force generated by the press unit is stored in the restoring force generation unit 132, the restoring force is applied to the second frame 120 in a direction opposite to the pressing direction.

The opening OP may be formed as a predetermined size according to the restoring force generated by the gap adjusting unit 130 as shown in FIG. 3D. That is, a distance between the first frame 110 and the second frame 120 may be may change from the second distance "d2" to the third distance "d3." In the drawing, the third distance d3 is illustrated to be longer than the second distance "d2," an embodiment of the present inventive concept is not limited thereto. The third distance "d3" may change according to shrinkage and/or tensile force applied to the deposition mask 140 and/or an amount of the restoring force generated from the gap adjusting unit 130.

When the deposition mask 140 is extended and then welded to be fixed to the frame unit, contraction or expansion is generated in a lengthwise direction (x direction) and a width direction (y direction) of the deposition mask 140. Such a deformation of the deposition mask 140 causes deformation of the deposition pattern portion 141 to reduce the precision and yield of the deposition.

The gap adjusting unit 130 may restrict a movement of the deposition mask 140 to the first direction and may restrict the deformation of a deposition pattern even when the deposition mask 140 is contracted or expanded.

The gap adjusting unit 130 stores the restoring force corresponding to a force generated when the deposition mask 140 is contacted or expanded, to prevent the deformation of the deposition mask 140. In response to an amount of the force generated when the deposition mask 140 is contracted, the restoring force is stored in the gap adjusting unit 130 by pressing the second frame 120. The restoring force is applied to the deposition mask 140 in a direction opposite to a direction of the force generated when the deposition mask 140 is contracted, to prevent the deformation of the deposition mask 140.

The gap adjusting unit 130 may be formed to contract or expand in the first direction to guide the second frame 120 in the first direction. When the deposition mask 140 contracts or expands after being fixed to the frame unit, the movement is allowed in the x direction, but the movement in the y direction may be restricted. That is, the deformation of the deposition pattern is minimized by flexibly responding to the movement of the deposition mask 140.

Figure 4:
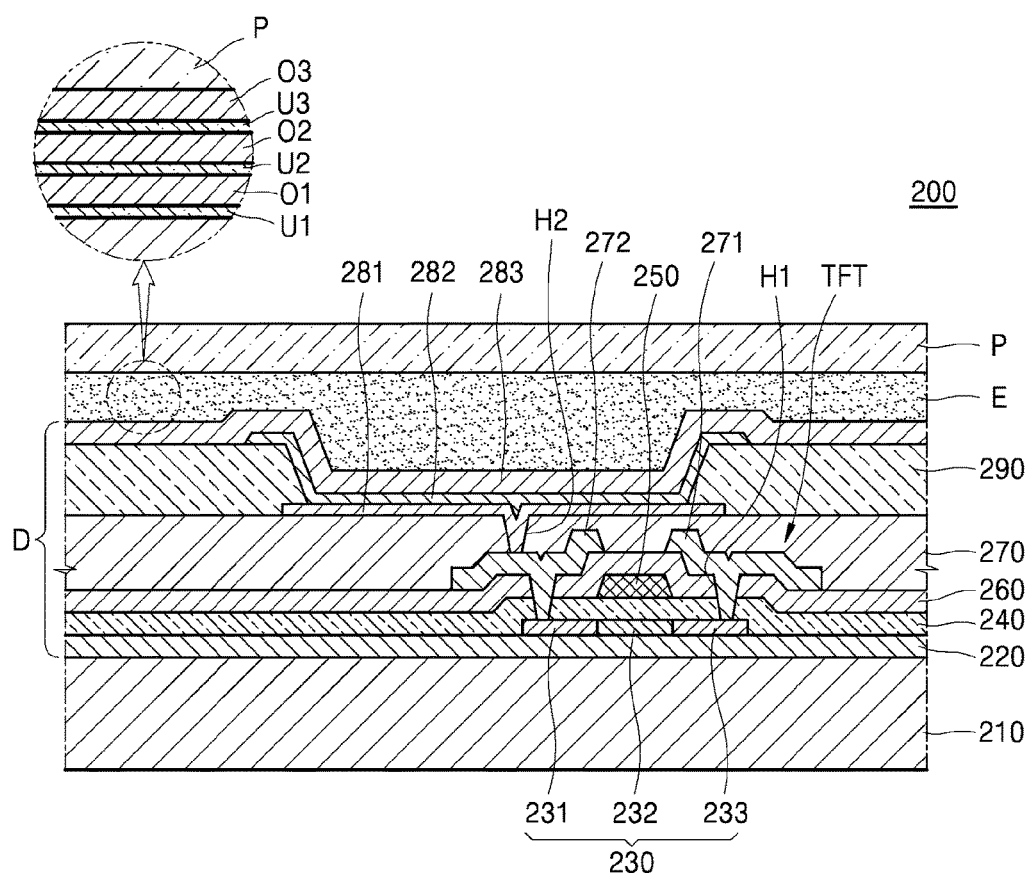
FIG. 4 is a cross-sectional view illustrating a sub-pixel of a display apparatus manufactured using the mask frame assembly of FIG. 1 according to an embodiment of the present inventive concept.

FIG. 4 is a view illustrating a sub-pixel of a display apparatus 200 manufactured using the mask frame assembly 100 of FIG. 1 according to an embodiment of the present inventive concept.

Here, the sub-pixel may include at least one thin film transistor (TFT) and an organic light emitting display device (OLED). A thin film transistor may not have to have the same structure as illustrated in FIG. 4 but the number and structure of the thin film transistor may be changed. Referring to FIG. 4, the display apparatus 200 may include a substrate 210, a display portion D, an encapsulation portion E, and a protection layer P.

The substrate 210 may be a flexible insulation material. For example, the substrate 210 may be a high polymer substrate, such as polyimide (PI), polycarbonate (PC), polyethersulphone (PES), polyethylene terephthalate (PET), polyethylenenaphthalate (PEN), polyarylate (PAR), fiber glass reinforced plastic (FRP), and so on.

In an embodiment, the substrate 210 may be a glass substrate having a thickness to be bendable. The substrate 210 may be a metal. The substrate 210 may be transparent, translucent, or opaque.

A buffer layer 220 may be formed on an upper surface of the substrate 210. The buffer layer 220 may include an organic compound and/or an inorganic compound. The buffer layer 220 may prevent oxygen and moisture and make a surface of the substrate 210 flat.

The buffer layer 220 may include at least one selected from organic compounds of acryl, polyimide, and polyester, or inorganic compounds of silicon oxide ($SiO_2$), silicon nitride ($SiN_x$), silicon oxynitride ($SiO_xN_y$), aluminum oxide ($AlO_x$), and aluminum oxynitride ($AlO_xN_y$).

A thin film transistor may be formed on the buffer layer 220. The thin film transistor may be referred to as a top gate transistor. However, an embodiment of the present inventive concept is not limited thereto. The thin film transistor may be a bottom gate transistor having a different structure.

After an active layer 230 arranged with a predetermined pattern is formed on the buffer layer 220, the active layer 230 is buried by a gate insulation layer 240. The active layer 230 may include a source area 231, a drain area 233 and a channel area 232 between the source area 231 and the drain area 233.

The active layer 230 may include various materials. For example, the active layer 230 may include an inorganic semiconductor material, such as amorphous silicon or crystalline silicon. As another example, the active layer 230 may include an oxide semiconductor. For example, the oxide semiconductor may include a metal element of groups 12, 13, and 14, such as Zinc (Zn), Indium (IN), Gallium (Ga), Tin (Sn), Cadmium (Cd), Germanium (Ge), Hafnium (Hf) and an oxide compound of a material selected from a combination thereof. Hereinafter, the active layer 230 formed with amorphous silicon will be explained hereinafter for the purpose of description.

A gate electrode 250 corresponding to the active layer 230 and an interlayer insulation layer 240 burying the gate electrode 250 are formed on an upper surface of the gate insulation layer 240.

A contact hole H1 is formed in the interlayer insulation layer 260 and the gate insulation layer 240, and a source electrode 271 and a drain electrode 272 are formed on the interlayer insulation layer 260 to contact the source area 231 and the drain area 233, respectively.

A passivation layer 270 is formed on the thin layer transistor TFT formed as described above, and a pixel electrode 281 of the OLED is formed on the passivation layer 270.

The pixel electrode 281 may be a transparent (or translucent) electrode or a reflective electrode. The transparent (or translucent) electrode may be formed with indium tin oxide (ITO), indium zinc oxide (IZO), zinc oxide (ZnO), indium oxide ($In_2O_3$), indium gallium oxide (IGO), or aluminum zinc oxide (AZO). The reflective electrode may be a reflective layer formed with Silver (Ag), Magnesium (Mg), Aluminum (Al), Platinum (Pt), Palladium (Pd), Gold (Au), Nickel (Ni), Neodymium (Nd), Iridium (Ir), Chromium (Cr), or a compound thereof, and a layer formed with ITO, IZO, ZnO or $In_2O_3$. However, an embodiment of the present inventive concept is not limited thereto. A structure and a material of the pixel electrode 281 may be changed variously.

The pixel electrode 281 contacts the drain electrode 272 of the thin layer transistor through a via-hole H2 formed in the passivation layer 270. The passivation layer 270 may include an inorganic compound and/or an organic compound, or a single layer or two or more layers. The passivation layer 270 may be a flattening layer having a lower surface and an upper surface which is flat regardless of a curvature of the lower surface, or a layer having the upper surface with the same curvature as the lower surface. And the passivation layer 270 may be a transparent insulation material to achieve micro-cavity effect.

After the pixel electrode 281 is formed on the passivation layer 270, a pixel defining layer 290 is formed to cover the pixel electrode 281 and the passivation layer 270. The pixel defining layer 290 may include an inorganic compound and/or an organic compound and may have an opening to expose the pixel electrode 181 therethrough.

And, an intermediate layer 282 and an opposite electrode (or counter electrode) 283 are formed on the pixel electrode 281.

Although the pixel electrode 281 functions as an anode and the opposite electrode 283 functions as a cathode, it is possible that polarities of the pixel electrode 281 and the opposite electrode 283 may have reversed, for example, the pixel electrode 281 functions as a cathode and the opposite electrode 283 functions as an anode.

The pixel electrode 281 and the opposite electrode 283 are insulated from each other by the intermediate layer 282, and light is emitted from an organic light emission layer by applying opposite polarities to the intermediate layer 282.

The intermediate layer 282 may include the organic light emission layer. In an alternative example, the intermediate layer 282 may include an organic emission layer (or organic light emission layer) and at least one of a hole injection layer (HIL), a hole transport layer (HTL), an electron transport layer (ETL), and an electron injection layer (EIL).

Although a light emitting material is separately included in the respective pixels in the organic light emission layer according to the embodiments as described above, the present inventive concept is not limited thereto. The organic light emission layer may be a common organic light emission layer usable for the entire pixels regardless of locations of the pixels. Here, the organic light emission layer may include light emitting materials to respectively emit red light, green light, and blue light, for example. The light emitting materials may be stacked in a vertical direction or disposed in a mixed manner. The light emitting materials may include materials to emit a combination of different colors as long as white light is emitted from the combination of the different colors. And, a color conversion layer or a color filter may be further included to convert the emitted white light to a certain color.

After the display portion D is formed on the substrate 210, the encapsulation layer E may be formed on the display portion D. The encapsulation layer E may include a plurality of inorganic layers or may include an inorganic layer and/or an organic layer.

The encapsulation layer E may include a high polymer. The encapsulation layer E may be a single layer or laminated layers formed with at least one of polyethylene terephthalate, polyimide, polycarbonate, epoxy, polyethylene, and polyacrylate. The organic layer may include polyacrylate. The organic layer may be a layer polymerized from monomer compounds including a di-acrylate-based monomer and a tri-acrylate-based monomer. The monomer compounds may include a mono-acrylate-based monomer. Also, the monomer compounds may include a photoinitiator, such as thermoplastic polyolefin (TPO), however, the present inventive concept is not limited thereto. The monomer compounds may include epoxy, polyimide, polyethylene terephthalate, polycarbonate, polyethylene, and polyacrylate.

The inorganic layer of the encapsulation layer E may be a single layer or laminated layers having metal oxide or oxynitride. The inorganic layer may be one of silicon oxide ($SiO_2$), silicon nitride ($SiN_x$), aluminum oxide ($Al_2O_3$), titanium oxide ($TiO_2$), zirconium oxide ($ZrO_x$), and zinc oxide (ZnO).

The encapsulation layer E includes an uppermost surface exposed outside thereof, and the uppermost surface may be formed with an inorganic layer to protect an organic light emission element from introduction of moisture.

The encapsulation layer E may include at least one sandwich-like structure having at least one organic layer inserted between the inorganic layers. In another example, the encapsulation layer E may include at least one sandwich-like structure having at least one inorganic layer inserted between the organic layers. For example, the encapsulation layer E may include a first inorganic layer U1, a first organic layer O1, a second inorganic layer U2, a second organic layer O2, a third inorganic layer U3, and a third organic layer O3 which are disposed on an organic light emission device OLED in order.

A halogenated metal layer having a metal fluoride, such as lithium fluoride LiF, may be further included between the organic light emission device and the first inorganic layer U1. The halogenated metal layer may be formed according to a sputtering method to prevent the organic light emission device from be damaged.

The first organic layer O1 may have an area smaller than the second inorganic layer U2, and the second organic layer O2 may have an area smaller than the third inorganic layer U3.

Here, the encapsulation layer E is not limited to the embodiment described above. It is possible that the encapsulation layer E may include a structure having the inorganic layer and the organic layer which are laminated in various forms.

A protection layer P may be formed on the encapsulation layer E. The protection layer P may be formed in various methods. For example, the protection layer P may be formed according to a sputtering method, an ion beam deposition method, an evaporation method, or a chemical vapor deposition method.

The protection layer P may include metallic oxide or nitride, such as silicon nitride ($SiN_x$), silicon oxynitride ($SiO_xN_y$), titanium oxide ($TiO_x$), titanium nitride ($TiN_x$), titanium oxinitride ($TiO_xN_y$), zirconium oxide ($ZrO_x$), tantalum nitride ($TaN_x$), tantalum oxide ($TaO_x$), hafnium oxide ($HfO_x$), or aluminum oxide ($AlO_x$).

The protection layer P may be formed to cover entire sides of the encapsulation layer E. Accordingly, the protection layer P may prevent moisture or oxygen from being introduced into the encapsulation layer E to extend a life span of the encapsulation layer E.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mask frame assembly, comprising:
    a frame unit having a pair of first frames and a pair of second frames, each of the first frames extending in a first direction and spaced apart each other, each of the second frames extending in a second direction crossing the first direction and spaced apart each other, the second frames being disposed at both ends of the first frames to form an opening defined as an area surrounded by the first frames and the second frames;
    a deposition mask extended in the first direction, both ends of the deposition mask being fixed to the second frames; and
    gap adjusting units installed between the first frames and the second frames,
    wherein the gap adjusting units adjust a distance between the first frames and the second frames to change the area of the opening, and
    wherein the gap adjusting unit comprises: a guide member guiding the second frame to linearly move in the first direction; and a spring wire surrounding at least a portion of the guide member and having one end fixed to an end of the first frame and the other end fixed to an end of the second frame.

2. The mask frame assembly of claim 1, wherein the first frames are shorter than the second frames.

3. The mask frame assembly of claim 1, wherein the deposition mask is extended and then fixed to the second frames in a state that a distance between the first frames and the second frames is decreased by an external force applied to the frame unit.

4. The mask frame assembly of claim 3, wherein, when the external force is removed from the frame unit, the distance between the first frames and the second frames changes to a predetermined distance according to a restoring force stored in the gap adjusting units.

5. The mask frame assembly of claim 3, wherein the deposition mask comprises one or more deposition masks, and an amount of the external force applied to the frame unit is variable according to the number of the deposition masks.

6. The mask frame assembly of claim 3, wherein the amount of the external force applied to the frame unit decreases when the number of the deposition masks increases.

7. The mask frame assembly of claim 1, wherein the guide member is formed as a prismatic shape column and inserted into one of the second frames to linearly move in the first direction.

8. A mask frame assembly, comprising:
a pair of first frames arrayed in a first direction, and a pair of second frames arrayed in a second direction to form an opening surrounded by the first frames and the second frames;
a gap adjusting unit configured to connect the first frames and the second frames to adjust size of the opening;
a deposition mask extending in the first direction and fixed to the pair of second frames, and
wherein the gap adjusting unit comprises: a guide member guiding the second frame to linearly move in the first direction; and a spring wire surrounding at least a portion of the guide member and having one end fixed to an end of the first frame and the other end fixed to an end of the second frame.

9. The mask frame assembly of claim 8, wherein the deposition mask is fixed to the pair of the second frames in a state that the size of the opening is reduced when the pair of the second frames contract in the first direction.

10. The mask frame assembly of claim 9, wherein the deposition mask comprises one or more deposition masks, and
an amount of external force applied to the second frames decreases when the number of the deposition masks increases.

* * * * *